United States Patent
Nguyen et al.

[11] Patent Number: 6,157,336
[45] Date of Patent: Dec. 5, 2000

[54] TARGET SPECIFIC FOLDED ANALOG TO DIGITAL CONVERTER FOR DIRECT ACCESS STORAGE DEVICE (DASD)

[75] Inventors: Tri C. Nguyen; Joe M. Poss, both of Rochester, Minn.

[73] Assignee: International Business Machines Corporation, Armonk, N.Y.

[21] Appl. No.: 09/143,875

[22] Filed: Aug. 31, 1998

[51] Int. Cl.[7] .............................. H03M 1/12; H03M 1/62
[52] U.S. Cl. ........................................... 341/155; 341/139
[58] Field of Search ................................. 360/45, 46, 51, 360/65, 69; 348/572; 375/263; 341/100, 118, 139, 155, 138, 158, 120

[56] References Cited

U.S. PATENT DOCUMENTS

| | | | |
|---|---|---|---|
| 5,260,703 | 11/1993 | Nguyen et al. | 341/100 |
| 5,734,680 | 3/1998 | Moore et al. | 375/263 |
| 5,736,952 | 4/1998 | Kertis et al. . | |
| 6,023,383 | 2/2000 | Glover et al. | 360/46 |
| 6,037,886 | 3/2000 | Staszewski et al. | 341/139 |

OTHER PUBLICATIONS

IBM Patent Application RO997–051, "Low Power Analog Signal Processing Circuit", By Joe M. Poss, Ser. No. 08/891, 517, filed Jul. 11, 1997.

IBM Patent Application RO997–052, "Analog Signal Processing Circuit With Integrated Gain and Timing Error Signal Processing", By Joe M. Poss, Ser. No. 08/891,378, filed Jul. 11, 1997.

IBM Patent Application RO997–053, "Signal Error Generating Circuit for an Analog Signal Processing Channel ", by Joe M. Poss, Ser. No. 08/891,489, filed Jul. 11, 1997.

*Primary Examiner*—Patrick Wamsley
*Attorney, Agent, or Firm*—Joan Pennington

[57] ABSTRACT

A target specific folded analog to digital converter (ADC) is provided, such as for use in a data detection channel in a direct access storage device (DASD). The high speed analog to digital converter (ADC) includes a digital signal decoder for decoding specific target levels of an analog signal. An analog to digital converter section of the ADC converts an analog error signal of the analog signal to digital decoder outputs representing the analog error signal.

14 Claims, 9 Drawing Sheets

TARGET SPECIFIC FOLDED ANALOG TO DIGITAL CONVERTER FOR DIRECT ACCESS STORAGE DEVICE (DASD)

FIELD OF THE INVENTION

The present invention relates to methods and apparatus for detecting data, and more particularly to, a target specific folded analog to digital converter (ADC) for a data detection channel in a direct access storage device (DASD).

DESCRIPTION OF THE RELATED ART

Analog signal processing circuits such as those used to process analog signals read by disk drive transducer heads from magnetic disks in a data detection channel typically include an analog to digital converter (ADC).

For example, U.S. Pat. No. 5,736,952 to Robert A. Kertis and Joe M. Poss, issued Apr. 7, 1998 and assigned to the present assignee, discloses a high speed analog to digital converter (ADC) for use in a direct access storage device (DASD). The disclosed ADC includes a driver section, a series string of $(2^N)-1$ comparators C1 through C63, and a decode section. Outputs of the series string of comparators is coupled to the decode section for providing a digital output.

A need exists to use folding techniques to minimize the power requirements in the disk drive ADC. It is desirable to make the folding target specific based on the data channel signal response such as, but not limited to, PRML data channel recording. A need exists to provide an improved implementation of a high speed, low power analog to digital converter (ADC), particularly for use in a disk drive data detection channel.

SUMMARY OF THE INVENTION

A principal object of the present invention is to provide improved a target specific folded analog to digital converter (ADC) for a data detection channel in a direct access storage device (DASD). Other important objects of the present invention are to provide such apparatus substantially without negative effects; and to provide such apparatus that overcome some of the disadvantages of prior art arrangements.

In brief, a target specific folded analog to digital converter (ADC) is provided, such as for use in a data detection channel in a direct access storage device (DASD). The high speed analog to digital converter (ADC) includes a digital signal decoder for decoding specific target levels of an analog signal. An analog to digital converter section of the ADC converts an analog error signal of the analog signal to digital decoder outputs representing the analog error signal.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
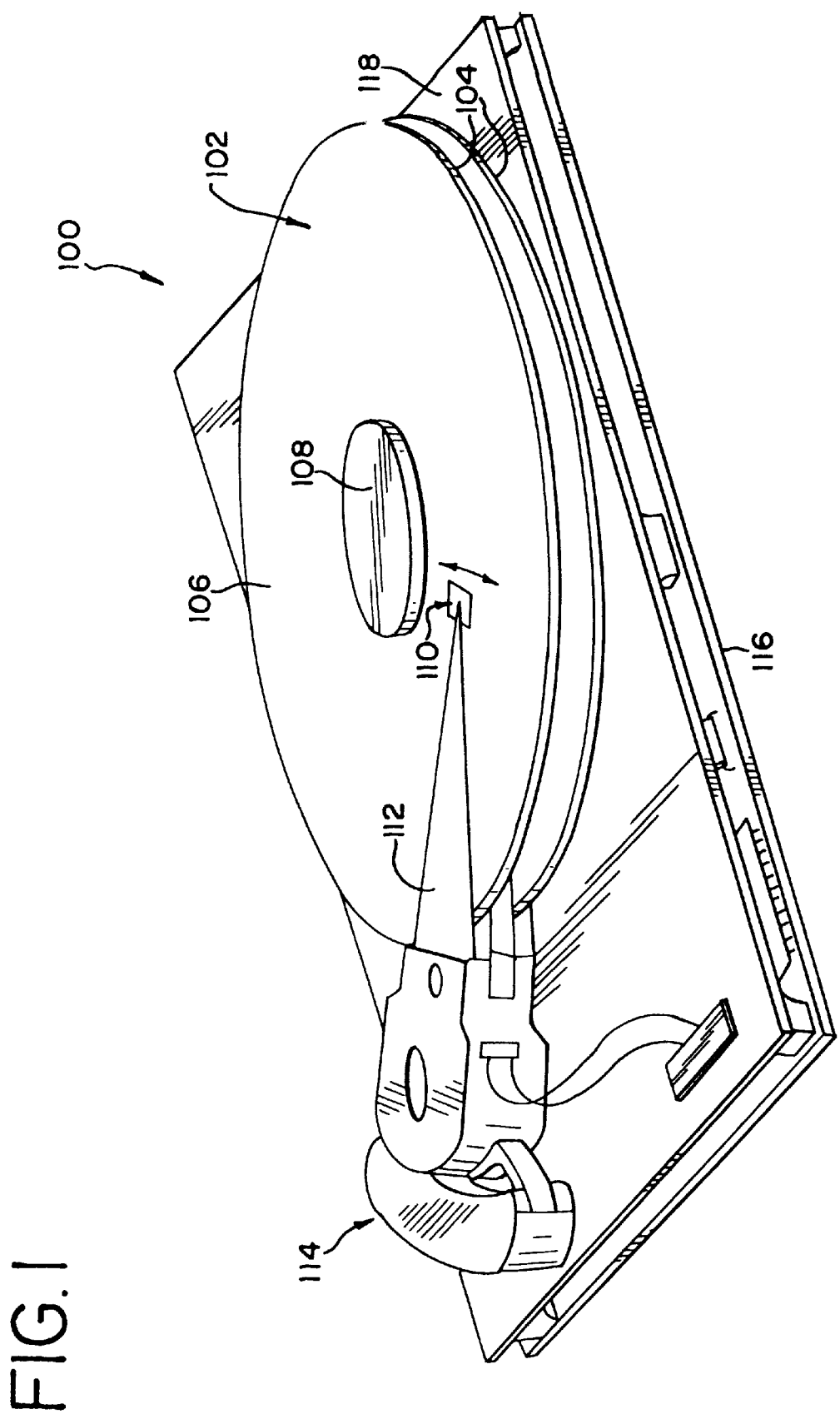
FIG. 1 is a diagrammatic view of a direct access storage device (DASD) embodying the present invention.

Having reference now to the drawings, in FIG. 1 there is illustrated a direct access data storage device (DASD) generally designated as 100 including a stack 102 of disks 104 each having at least one magnetic surface 106. The disks 104 are mounted parallel to one another for simultaneous rotation on and by an integrated spindle and motor assembly 108. Information on each magnetic disk surface 106 is read from or written to the disk surface 106 by a corresponding transducer head assembly 110 movable in a path having a radial component across the rotating disk surface 106.

Each transducer head assembly 110 is carried by an arm 112. The arms 112 are ganged together for simultaneous pivotal movement by a voice coil motor (VCM) magnet assembly 114. Drive signals applied to the VCM magnet assembly 114 cause the arms 112 to move in unison to position the transducer head assemblies 110 in registration with information storage tracks on the disk surfaces 106 where information is written or read. As shown in FIG. 1, an electronics card 116 is mounted together with a base support 118 of DASD 100. The utility of the present invention is not restricted to the details of a particular DASD construction.

Figure 2:
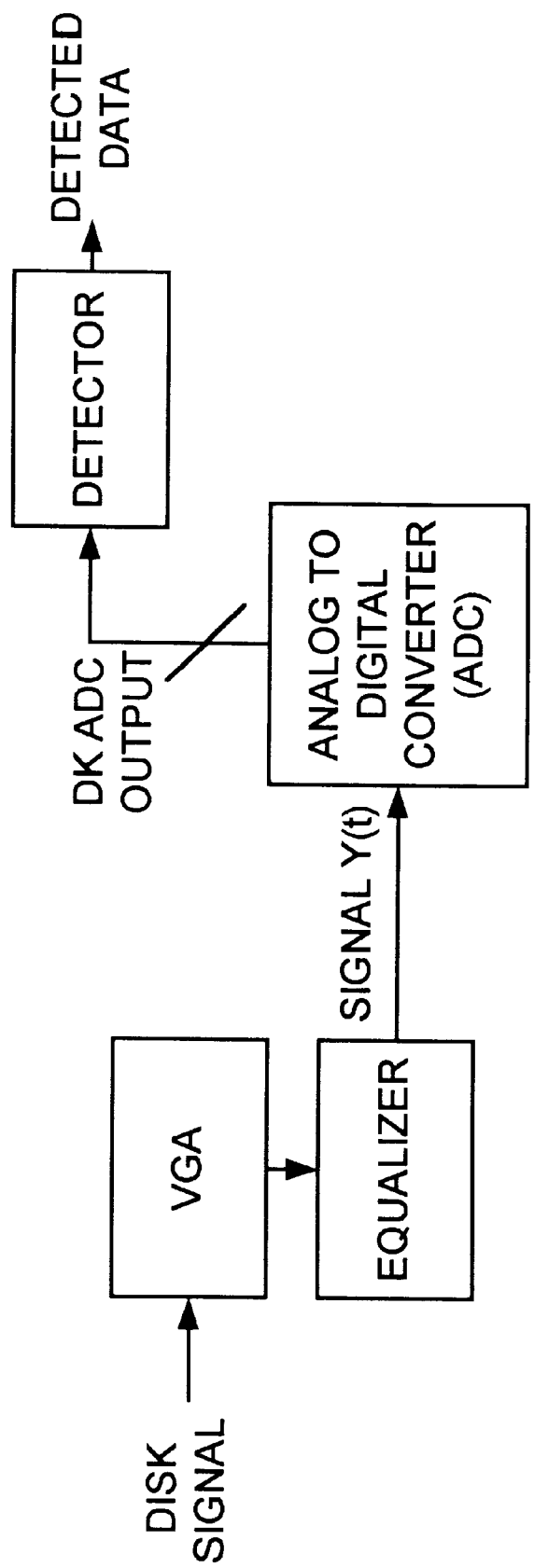
FIG. 2 is a block diagram illustrating a conventional data detection channel in a DASD.

FIG. 2 illustrates a conventional data detection channel in a DASD. A disk readback signal is applied to a variable gain amplifier (VGA) and the amplified read signal is applied to an equalizer. The equalized or filtered read signal Y(t) is converted to digital form by an analog-to-digital converter (ADC) that provides, for example, 64 possible 6-bit sampled values or 48 possible sampled values. The output samples Dk of the ADC are applied to a detector to complete the data detection process, such as a maximum-likelihood (ML) detection process for data read back.

Figure 3:
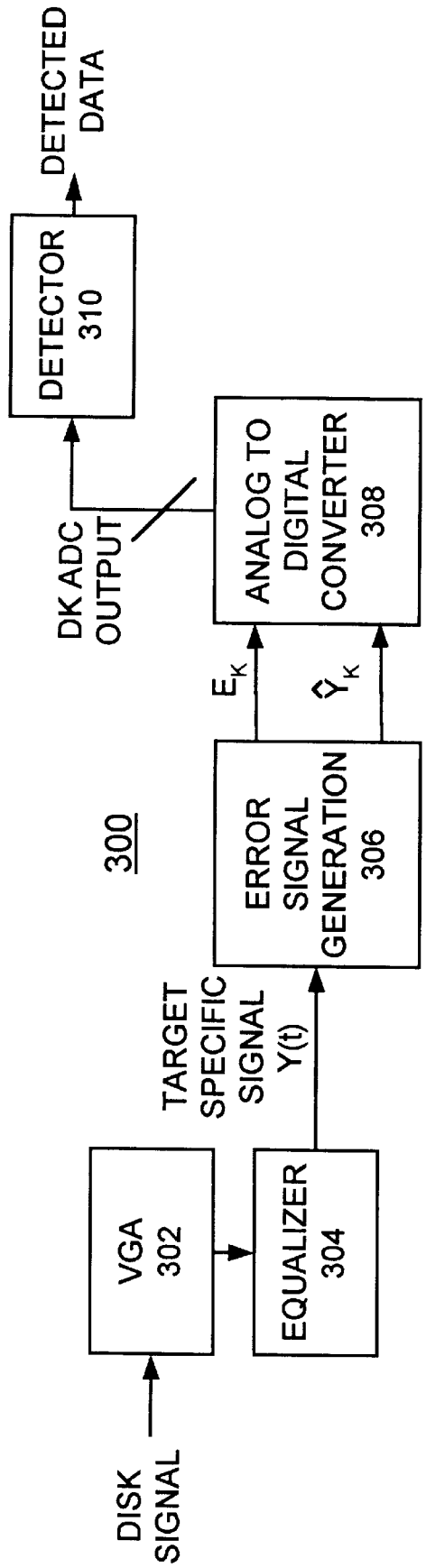
FIG. 3 is a block diagram illustrating a data detection channel in the DASD of FIG. 1 embodying the present invention.

FIG. 3 illustrates a data detection channel 300 in the DASD 100 embodying the present invention. In data detection channel 300, the disk readback signal is applied to a variable gain amplifier (VGA) 302 and the amplified read signal is applied to an equalizer 304. An error signal generator circuit 306 is used to fold the data signal around specific target values. The equalized, target specific read signal Y(t) is converted by the error signal generator circuit 306 to an error signal Ek and target specific or idealized PRML-IV detected output signal Ÿk having a value of 0, +1 or −1 at time k. The error signal Ek and the target specific signal Ÿk is converted to digital form by an analog-to-digital converter (ADC) 308 of the invention. The output samples Dk of the ADC 308 are applied to a detector 310, such as a maximum-likelihood (ML) Viterbi detector to complete the data detection process for data read back.

Figure 4:
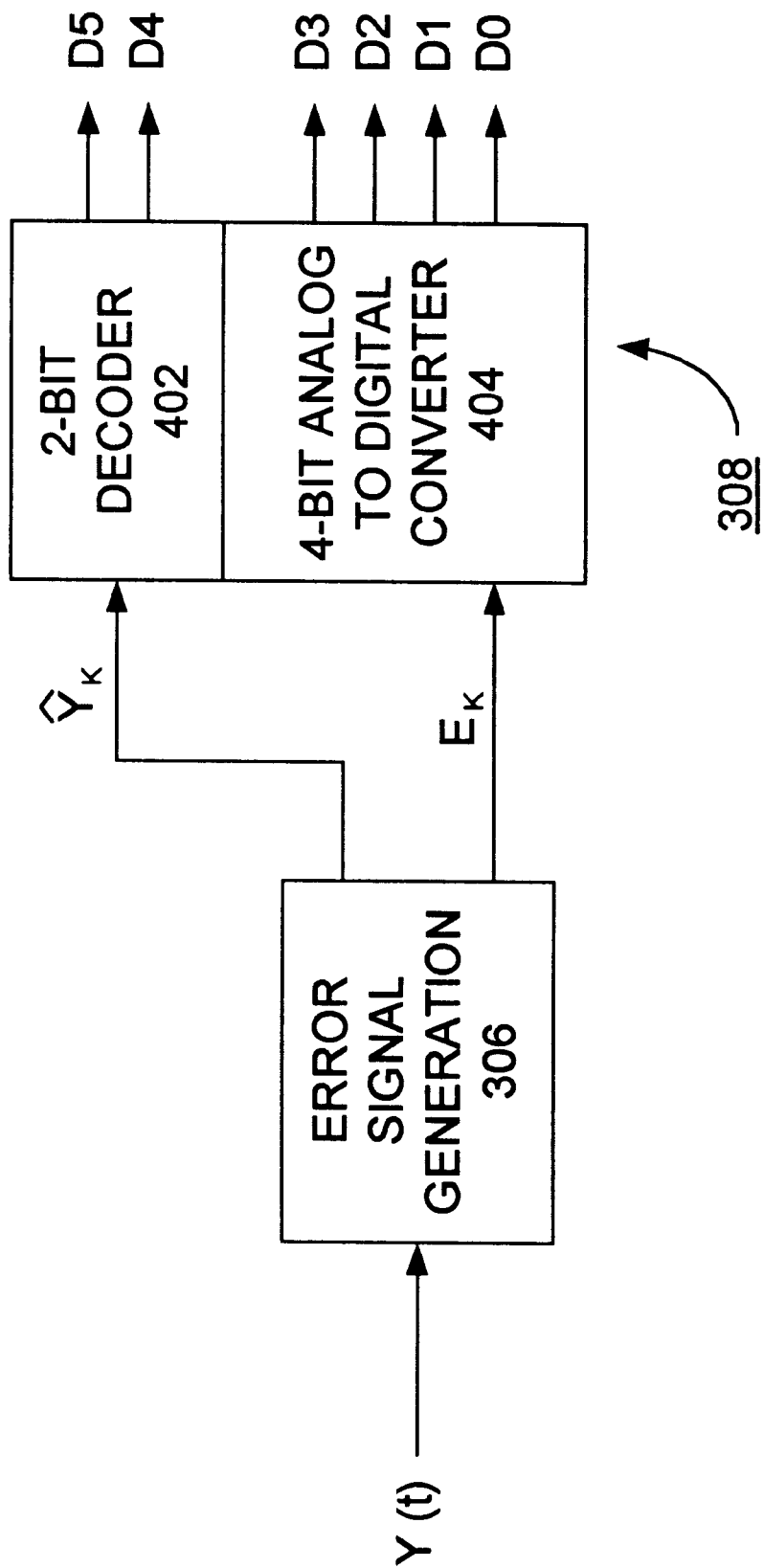
FIG. 4 is a schematic diagram illustrating an analog to digital converter in the data detection channel of FIG. 3 embodying the present invention.

Having reference to FIG. 4, in accordance with features of the invention, the error signal generator circuit 306 is used in conjunction with the ADC 308 of the invention as shown. ADC 308 of the preferred embodiment includes a 2-bit decoder 402 for providing decoder outputs D4, D5 representing the three target values of +1, 0, and −1 corresponding to target specific or idealized PRML-IV detected output signal $\ddot{Y}k$. ADC 308 of the preferred embodiment includes a 4-bit analog to digital converter 404 providing decoder outputs D0, D1, D2, D3 representing the analog error signal Ek.

Figure 5:
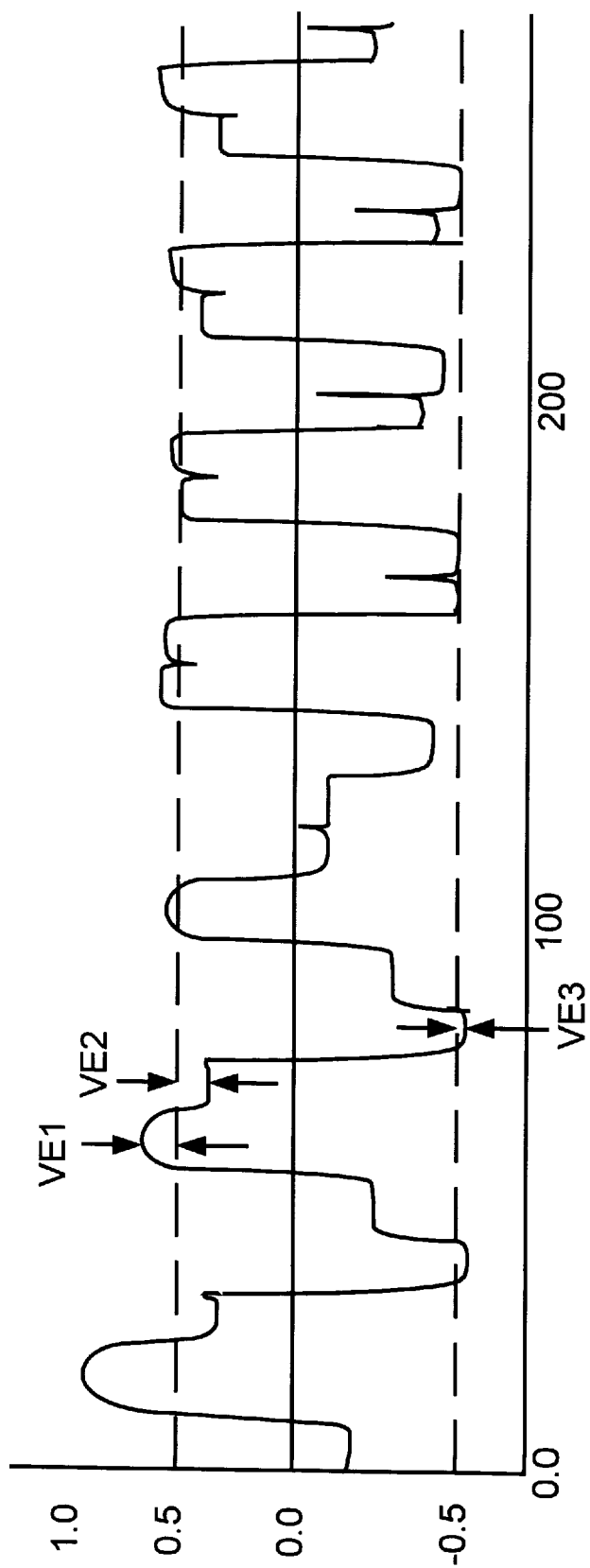
FIG. 5 is a graph illustrating a class IV partial response (PR4) signal output of a data detection channel in the DASD of FIG. 1 with magnitude of the PR4 signal along the vertical axis and time along the horizontal axis.
Figure 6:
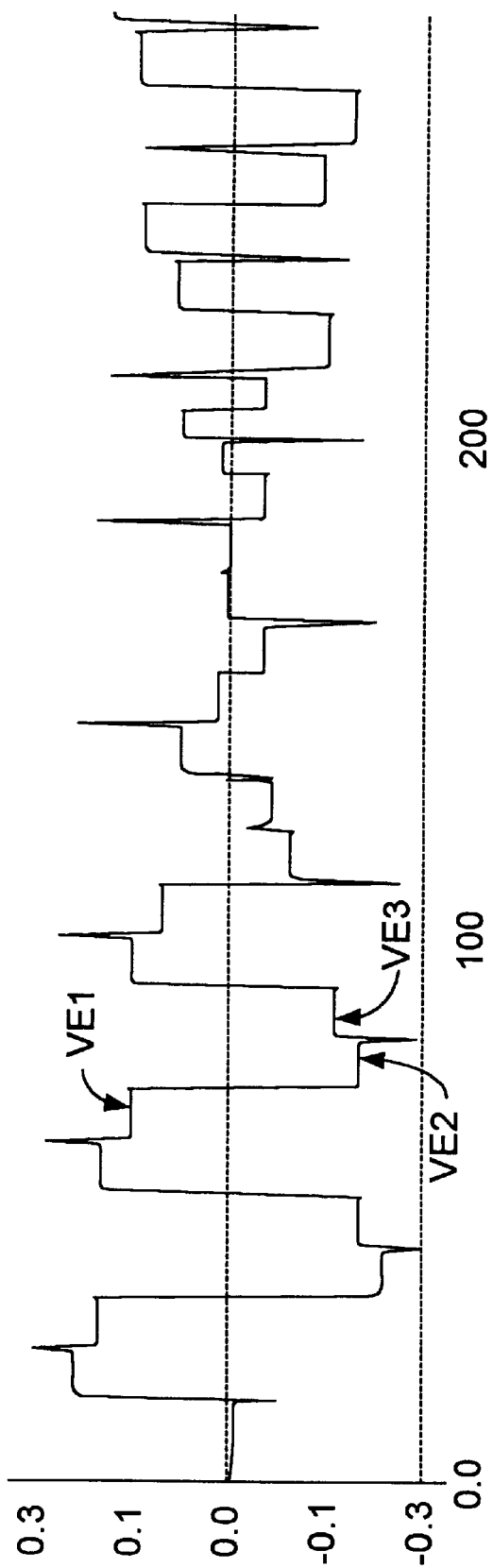
FIG. 6 is a graph illustrating an error signal folded around the target values of the class IV partial response (PR4) signal output of FIG. 5 with magnitude of the error signal along the vertical axis and time along the horizontal axis.
Figure 7:
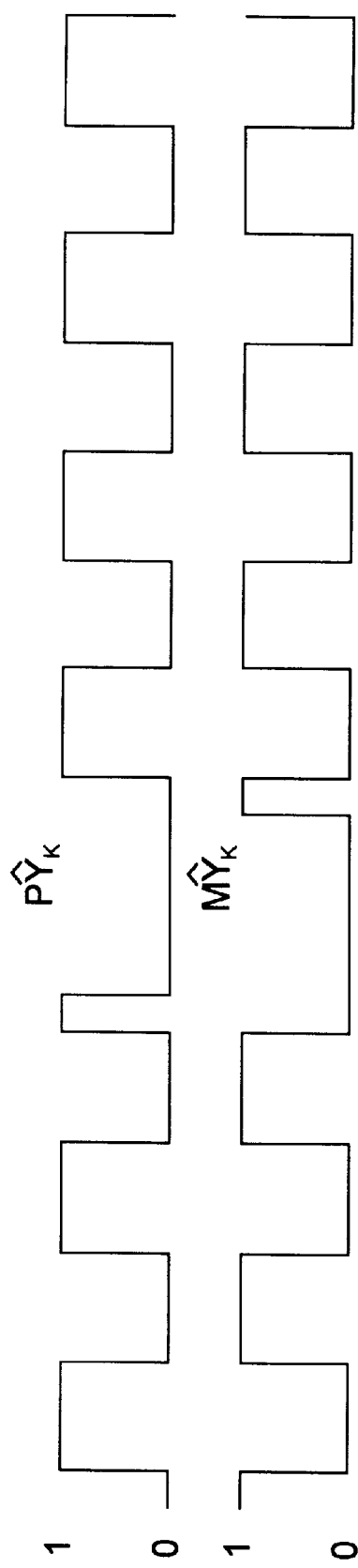
FIG. 7 is a graph illustrating two bits used for encoding the target values of the class IV partial response (PR4) signal output of FIG. 5.

Having reference to FIGS. 5–7, operation of the ADC 308 together with the error signal generation circuit 306 may be understood. FIG. 5 is a graph illustrating a class IV partial response (PR4 or PRML-IV) signal output of a data detection channel 300. The illustrated PRML-IV signal uses the target values are +1, 0 and −1. The PRML-IV signal is denoted as Y(t) at the output of the equalizer 304 applied to the error signal generation circuit 306 in FIG. 3.

FIG. 6 is a graph illustrating an error signal Ek folded around the target values, +1, 0 and −1 of the illustrated class IV partial response (PRML-IV) signal Y(t). In FIG. 6, the illustrated folded error signal Ek results in ⅓ as large signal amplitude going into the ADC 308 as compared to the signal Y(t) applied to the ADC of the conventional arrangement of FIG. 2. This error signal is denoted as Ek at the output of the error signal generation circuit 306 of FIGS. 3 and 4. In FIG. 6, noted on the PR4 signal Y(t) are signal levels VE1, VE2 and VE3. In FIG. 6, the illustrated folded error signal Ek shows the same voltage levels VE1, VE2 and VE3 that are now folded around zero.

FIG. 7 is a graph illustrating two signals $P\ddot{Y}k$ and $M\ddot{Y}k$ used by the 2-bit decoder 402 for encoding the target values of the class IV partial response (PRML-IV) signal output target specific or idealized PRML-IV detected output signal $\ddot{Y}k$. To indicate which target level zone +1, 0, or −1 corresponds to the applied signal to the ADC 308, the $\ddot{Y}k$ provides digital information that the ADC 2-bit decoder 402 uses to decode the 2-bit ADC output D4, D5. The illustrated digital signals $P\ddot{y}k$ and $M\ddot{Y}k$ are needed to indicate which zone target of the applied ADC input signal, Ek. Since PR-IV uses three target values only two digital bits are needed to complete the ADC decoding. If another signal class is used that has more than 4 target values, such as five target values with extended partial-response maximum-likelihood (EPRML), then more digital bits will be needed for the ADC decoder 402. $\ddot{Y}k$ includes the two digital bits denoted as $P\ddot{Y}k$ and $M\ddot{Y}k$. If $P\ddot{Y}k$ is a 1, then the Ek for that period is from a +1 target zone. If $M\ddot{Y}k$ is a 1 then the Ek for that period is from a −1 target zone. If $P\ddot{Y}k$ and $M\ddot{Y}k$ are both low then the Ek for that period is from the 0 zone target.

Figure 8:
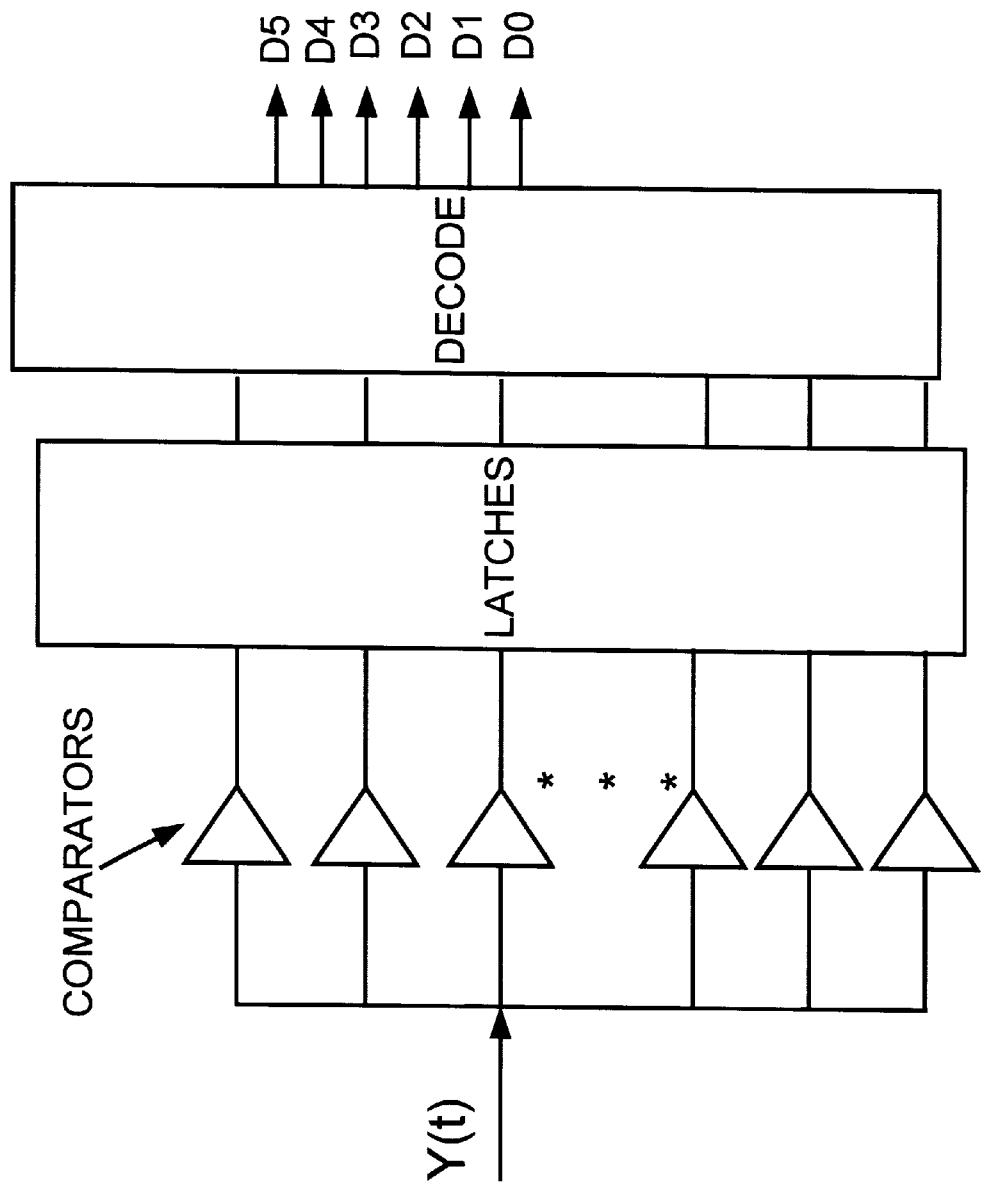
FIG. 8 is a schematic diagram illustrating a conventional analog to digital converter.

FIG. 8 is a schematic diagram illustrating a conventional 6-bit high speed or flash analog to digital converter which typically includes a series string of comparators. For example, in two known flash ADC implementations, 48 or 63 series connected comparators are used for providing 6 decoder outputs. Each comparator is connected to a corresponding latch. A decode section provides the 6 decoder outputs D0, D1, D2, D3, D4, and D5.

Figure 9:
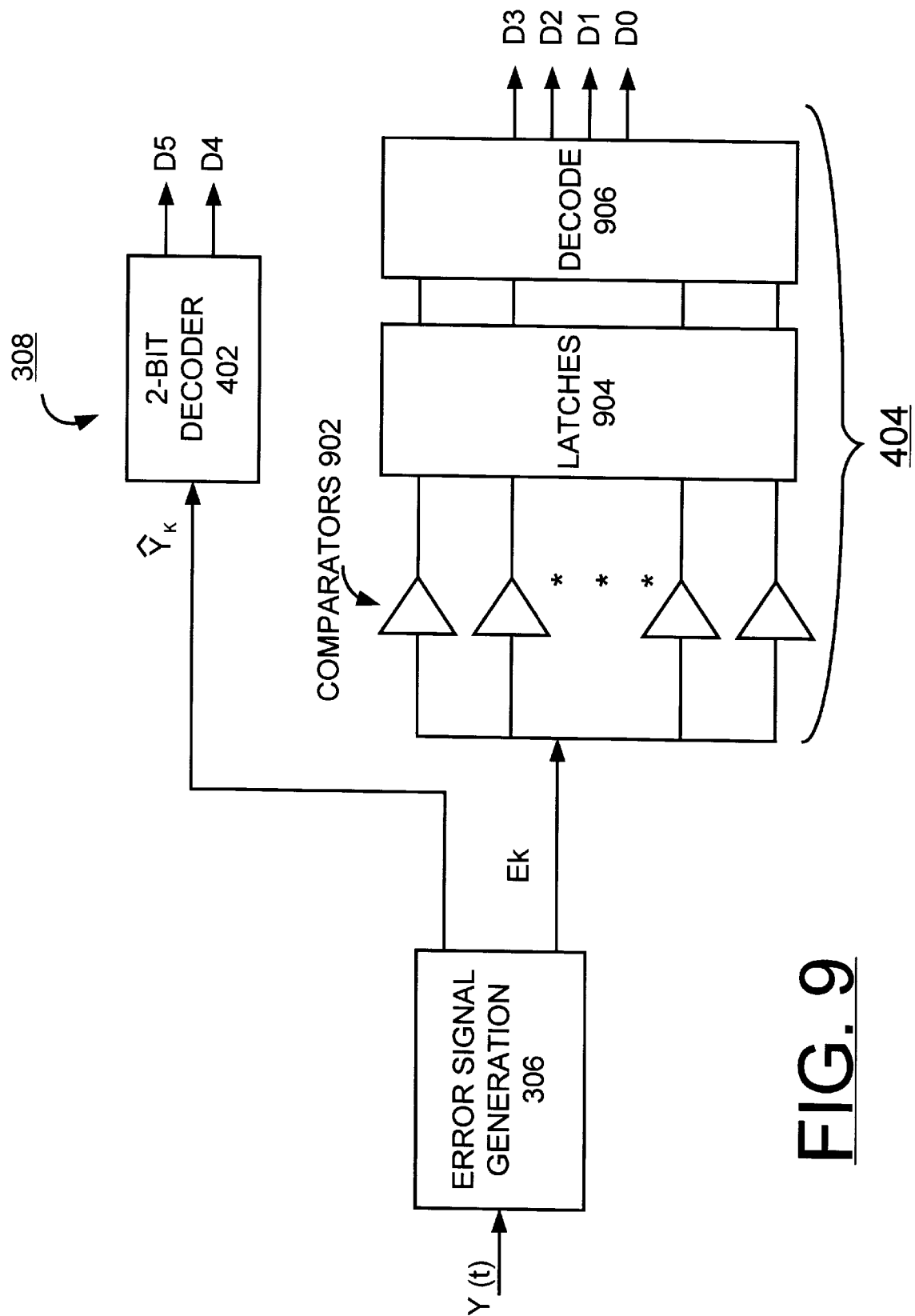
FIG. 9 is a schematic diagram illustrating a high speed differential analog to digital converter implementation of the preferred embodiment.

FIG. 9 is a schematic diagram illustrating an implementation of the high speed or flash differential analog to digital converter 308 of the preferred embodiment. As shown in FIG. 9, ADC 308 of the preferred embodiment includes the 2-bit decoder 402 and the 4-bit analog to digital converter 404 providing decoder outputs D0, D1, D2, D3 representing the analog error signal Ek is defined by a plurality of comparators 902. Each comparator 902 is connected to a corresponding latch 904. A decode section 906 provides decoder outputs D0, D1, D2, D3. In the illustrated implementation of ADC 308 in FIG. 9, either 16 or 21 series connected comparators 902 are used for providing the 4 decoder outputs.

Using the target specific folding technique with PR-IV signal processing, ADC 308 is implemented with only 16 or 21 comparators 902 to obtain the 4 least significant bits D0 to D3 from the applied Ek information. As shown in FIG. 8, a 6-bit flash ADC typically includes 48 or 63 comparators. The reduced signal amplitude or ⅓ less signal amplitude, Ek, enables the ADC 308 to be reduced by a factor of 3. For the flash ADC 404 of FIG. 9, the number of flash comparators 902 is reduced by a factor of 3, for example, from 48 comparators to 16 comparators or from 63 comparators to 21 comparators as compared to the conventional flash ADC of FIG. 8. A conventional ADC typically consumes a comparatively large amount of power. The combination of the error signal generation circuit 306 with the 2-bit decoder 402 and the ⅓ sized ADC 404 can provide power savings over a single non-folded ADC outputting the same number of decoded bits. Simple decode logic implements the 2-bit decoder 402 to decode the two most significant bits D5 and D4 from the $\ddot{Y}k$ inputs, $P\ddot{Y}k$ and $M\ddot{Y}k$. With this target specific folding scheme the signal to noise of ADC 308 is unchanged.

While the present invention has been described with reference to the details of the embodiments of the invention shown in the drawing, these details are not intended to limit the scope of the invention as claimed in the appended claims.

What is claimed is:

1. A high speed analog to digital converter (ADC) used with an error signal generation circuit receiving an equalized target specific analog signal and converting the received equalized target specific analog signal to a target specific signal and an analog error signal including level transfer relative to a zero level of said analog signal for each specific target level, said high speed analog to digital converter (ADC) comprising:
   a digital signal decoder for decoding specific target levels of the target specific signal output of the error signal generation circuit; and
   an analog to digital converter for converting the analog error signal output of the error signal generation circuit to digital decoder outputs representing said analog error signal.

2. The high speed analog to digital converter (ADC) as recited in claim 1 wherein said digital signal decoder for decoding specific target levels of the target specific signal output of the error signal generation circuit includes a two-bit decoder.

3. The high speed analog to digital converter (ADC) as recited in claim 2 wherein said specific target levels of the target specific signal output of the error signal generation circuit includes three levels corresponding to +1, 0, and −1.

4. The high speed analog to digital converter (ADC) as recited in claim 1 wherein said level transfer relative to said zero level of said analog signal for each specific target level includes an error signal amount by which said analog signal differs from an identified specific target level.

5. The high speed analog to digital converter (ADC) as recited in claim 1 wherein said equalized target specific analog signal is a partial response signal output of a data detection channel in a direct access storage device.

6. The high speed analog to digital converter (ADC) as recited in claim 1 wherein said equalized target specific analog signal is a class IV partial response (PR-IV) signal output of a data detection channel in a direct access storage device and wherein said digital signal decoder for decoding specific target levels of the target specific signal output of the error signal generation circuit includes a two-bit decoder for decoding said specific target levels of said analog signal including +1, 0, and −1.

7. A direct access storage device including a data channel comprising:

at least one disk mounted for rotation about an axis and having at least one disk surface for storing data;

transducer means mounted for movement across said disk surface for reading and writing data to said disk surface;

an error signal generation circuit coupled to said transducer means for receiving an equalized target specific analog signal and said error signal generation circuit for converting the received equalized target specific analog signal to a target specific signal and an analog error signal including level transfer relative to a zero level of said analog signal for each specific target level;

an analog to digital converter (ADC) coupled to said error signal generation circuit for converting said target specific signal and an analog error signal to digital sample values, said analog to digital converter (ADC) including:

a digital signal decoder for decoding specific target levels of said target specific signal; and an analog to digital converter for converting said analog error signal from said error signal generation circuit to digital decoder outputs representing said analog error signal.

8. The direct access storage device as recited in claim 7 wherein said digital signal decoder for decoding specific target levels of said target specific signal includes a two-bit decoder for decoding said specific target levels of said target specific signal including +1, 0, and −1 providing decoder output D4, D5 representing said specific target levels of +1, 0, and −1.

9. The direct access storage device as recited in claim 8 wherein said analog to digital converter for converting said analog error signal from said error signal generation circuit to digital decoder outputs representing said analog error signal includes a 4-bit analog to digital converter providing decoder output D0, D1, D2, D3 representing said analog error signal.

10. The direct access storage device as recited in claim 7 wherein said equalized target specific analog signal is a partial response signal output of said data detection channel in the direct access storage device.

11. A high speed analog to digital converter (ADC) comprising:

an error signal generation circuit receiving an analog signal and generating both an analog error signal and specific target levels of said analog signal; said analog error signal including level transfer relative to a zero level of said analog signal for each specific target level;

a digital signal decoder for decoding said specific target levels of said analog signal; and an analog to digital converter for converting said analog error signal of said analog signal to digital decoder outputs representing said analog error signal.

12. The high speed analog to digital converter (ADC) as recited in claim 11 wherein said analog signal is a partial response signal output of said data detection channel in the direct access storage device.

13. The high speed analog to digital converter (ADC) as recited in claim 11 wherein said digital signal decoder for decoding specific target levels of said analog signal includes a two-bit decoder for decoding said specific target levels of said analog signal including +1, 0, and −1.

14. The high speed analog to digital converter (ADC) as recited in claim 11 wherein said analog signal is a class IV partial response (PR-IV) signal output of a data detection channel in a direct access storage device and wherein said digital signal decoder for decoding specific target levels of said analog signal includes a two-bit decoder for decoding said specific target levels of said analog signal including +1, 0, and −1.

* * * * *

UNITED STATES PATENT AND TRADEMARK OFFICE
CERTIFICATE OF CORRECTION

PATENT NO. : 6,157,336
DATED : December 5, 2000
INVENTOR(S) : Tri C. Nguyen; Joe M. Poss It is certified that error appears in the above-identified patent and that said Letters Patent is hereby corrected as shown below:

<u>Title page,</u>
TITLE to read as follows: -- TARGET SPECIFIC FOLDED ANALOG TO DIGITAL CONVERTER FOR DIRECT ACCESS STORAGE DEVICE (DASD) USING ANALOG ERRORS FOR TARGET SPECIFIC LEVELS OF PRML OUTPUT --

Signed and Sealed this

Fourth Day of December, 2001

Attest:

*Nicholas P. Godici*

NICHOLAS P. GODICI
*Attesting Officer*    *Acting Director of the United States Patent and Trademark Office*